(12) United States Patent
Katyal

(10) Patent No.: US 9,337,851 B2
(45) Date of Patent: May 10, 2016

(54) PHASE LOCKED LOOP CIRCUIT EQUIPPED WITH UNITY GAIN BANDWIDTH ADJUSTMENT

(71) Applicant: STMicroelectronics International N.V., Schiphol (NL)

(72) Inventor: Amit Katyal, Ghaziabad (IN)

(73) Assignee: STMicroelectronics International N.V., Schiphol (NL)

( * ) Notice: Subject to any disclaimer, the term of this patent is extended or adjusted under 35 U.S.C. 154(b) by 0 days.

(21) Appl. No.: 14/734,820

(22) Filed: Jun. 9, 2015

(65) Prior Publication Data

US 2015/0358025 A1  Dec. 10, 2015

(30) Foreign Application Priority Data

Jun. 9, 2014 (IN) .......................... 1562/DEL/2014

(51) Int. Cl.
*H03L 7/06* (2006.01)
*H03L 7/10* (2006.01)
*H03L 7/085* (2006.01)
*H03L 7/099* (2006.01)

(52) U.S. Cl.
CPC ............ *H03L 7/10* (2013.01); *H03L 7/085* (2013.01); *H03L 7/099* (2013.01)

(58) Field of Classification Search
USPC .................................. 327/147–149, 156–158
See application file for complete search history.

(56) References Cited

U.S. PATENT DOCUMENTS

| 6,429,734 | B1 * | 8/2002 | Wang | H03F 3/45941 327/156 |
| 7,259,633 | B2 * | 8/2007 | Lee | H03C 3/0925 327/157 |
| 8,362,848 | B2 * | 1/2013 | Raghunathan | H03L 7/0805 327/156 |
| 2009/0289606 | A1 * | 11/2009 | Lauxtermann | G09G 3/3433 320/166 |
| 2013/0214832 | A1 * | 8/2013 | Palwai | H03L 7/0891 327/156 |
| 2014/0320151 | A1 * | 10/2014 | Filippi | G06F 21/87 324/679 |
| 2015/0061767 | A1 * | 3/2015 | Francis | H03F 3/45188 330/258 |
| 2015/0207514 | A1 * | 7/2015 | Kim | H04B 1/40 455/73 |
| 2015/0358025 | A1 * | 12/2015 | Katyal | H03L 7/10 327/157 |

OTHER PUBLICATIONS

Liu, Wei, et al., "A PVT Tolerant 10 to 500 MHz All-Digital Phase-Locked Loop With Coupled TDC and DCO," pp. 314-321, *IEEE Journal of Solid-State Circuits*, Feb. 2010, vol. 45, No. 2.

* cited by examiner

*Primary Examiner* — Adam Houston
(74) *Attorney, Agent, or Firm* — Seed IP Law Group PLLC

(57) ABSTRACT

An electronic circuit is described in which a charge pump-based digital phase locked loop circuit is augmented with additional circuitry to monitor and control noise and power consumption. The additional circuitry includes a comparator and a measurement stage configured to measure and adjust a unity gain bandwidth of the phase locked loop. In one embodiment, the measurement stage includes two frequency-to-current converters and associated current mirrors.

17 Claims, 3 Drawing Sheets

PHASE LOCKED LOOP CIRCUIT EQUIPPED WITH UNITY GAIN BANDWIDTH ADJUSTMENT

BACKGROUND

1. Technical Field

The present disclosure generally relates to circuit design and in particular, to phased lock loop circuits.

2. Description of the Related Art

Phase locked loops (PLLs) are circuit building blocks commonly used in microelectronic components that require signal processing. Such components include, for example, radio transmitters and receivers that provide wireless communication functions in mobile computing devices, e.g., smart phones. Another application of phase locked loops is in clock generators for microprocessors. A phased locked loop is constructed as a negative feedback control system in which an output signal, the feedback signal, is generated from an input reference signal, such that the output signal maintains a certain phase relationship with the reference signal. A phase detector and a voltage-controlled oscillator cooperate to compare and lock the phases of the feedback and reference signals, according to the desired phase relationship.

BRIEF SUMMARY

An electronic circuit is described in which a charge pump-based digital phase locked loop circuit is augmented with additional circuitry to monitor and control noise and power consumption. The additional circuitry includes a comparator and a measurement stage configured to measure and adjust a unity gain bandwidth of the phase locked loop. In one embodiment, the measurement stage includes two frequency-to-current converters and associated current mirrors.

BRIEF DESCRIPTION OF THE SEVERAL VIEWS OF THE DRAWINGS

In the drawings, identical reference numbers identify similar elements. The sizes and relative positions of elements in the drawings are not necessarily drawn to scale.

DETAILED DESCRIPTION

Figure 1:
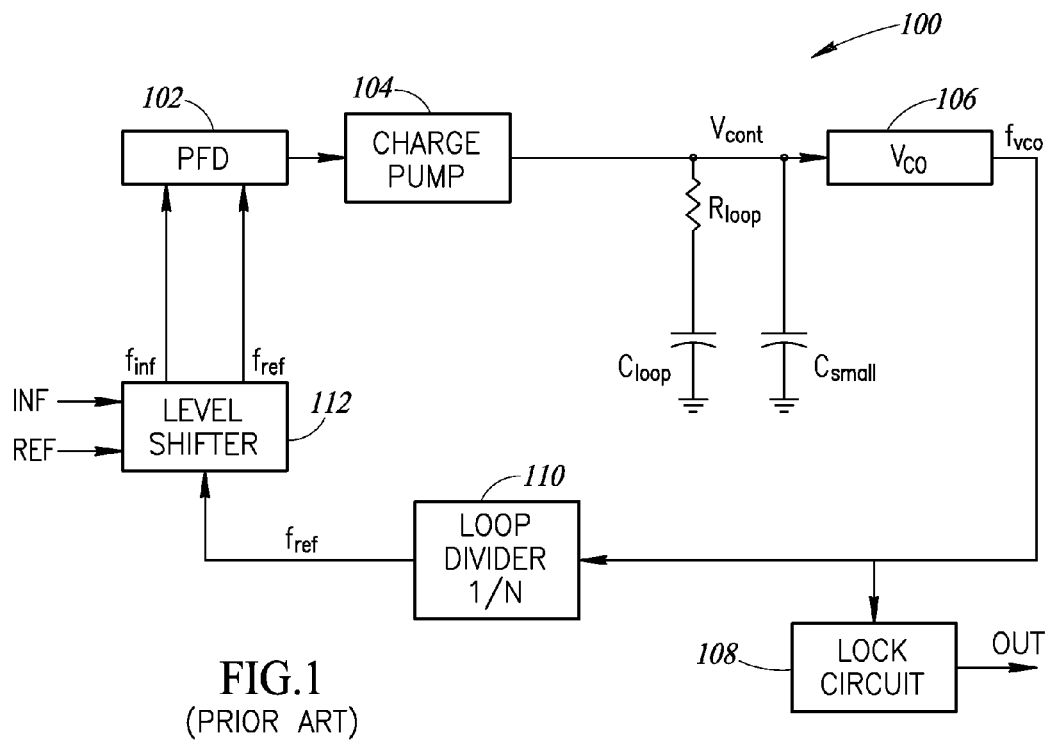
FIG. 1 is a block diagram showing components of a conventional phase locked loop (PLL) system, according to the prior art.

FIG. 1 shows a conventional digital phased lock loop (PLL) negative feedback circuit 100. The PLL circuit 100 includes a phase frequency detector (PFD) 102, a charge pump 104, a voltage-controlled oscillator (VCO) 106, a lock circuit 108, a loop divider 110, and a level shifter 112. Two inputs to the PLL circuit 100 are shown coupled to the level shifter 112—an input signal INF and a reference signal REF. An output signal, OUT, is produced by the lock circuit 108.

With reference to FIG. 1, operation of the PLL circuit 100 is summarized as follows: The PFD 102 compares frequencies of the input and reference signals INF and REF, and produces a signal having voltage $V_\phi$ that is proportional to their phase difference. The level shifter 112 adjusts the amplitudes of INF and REF to similar levels. The charge pump 104 acts as a low-pass filter for the phase difference signal. The filtered phase difference signal produced by the charge pump 104, having a current $I_{cp}$ and a voltage $V_{cont}$, is then used to control the voltage-controlled oscillator 106. The VCO 106 produces an oscillating signal at a frequency $f_{vco}$ that depends on the control signal level $W_{cont}$. Thus, when the control voltage increases, indicating that the input signal is out of phase with the reference signal, the oscillator will change its output frequency $f_{vco}$ so as to decrease the phase difference, thereby locking the output signal to the phase of the reference signal.

It is generally understood that closed loop systems are vulnerable to instability. Variation in the gain may cause the PLL circuit to be become more prone to instability. To maintain stability, it is therefore desirable for the gain of a loop circuit, such as a PLL, to be substantially constant.

The term unity gain bandwidth (UGB) is known in the art as a frequency for which the gain of an amplifier circuit is one. The gain and the UGB are related. If the gain varies, the UGB varies. An increase in the gain causes an increase in the UGB. It is desirable for the UGB to be large so that the noise performance of the PLL circuit is good. The UGB associated with the PLL circuit 100 is given by $$UGB = K_v \cdot I_p \cdot R_{loop} / N_{div},$$

wherein $K_v$ is the gain of the VCO 106, $I_p$ is a charge pump current, $R_{loop}$ is a loop filter resistance, and $N_{div}$ is the size of the loop divider. The value of $K_v$ in a conventional PLL circuit may vary by 100% or more, in some cases as much as a factor of 3.0-4.0 due to variation in operating temperature and in currents and voltages determined by the manufacturing process of the VCO 106. When $I_p$ is derived from the same resistance type as that of $R_{loop}$, the variation in $I_p$ and $R_{loop}$ is small. The variation in the UGB is further reduced by scaling $I_p$ with $N_{div}$. Taking into consideration mismatches in the various factors influencing the UGB, the UGB may still vary by a factor of 2 or 3 with changes in PVT. Such variation makes it difficult to optimize the conventional PLL circuit 100 to obtain good jitter performance and to meet power requirements.

The maximum value of UGB for the PLL circuit as described herein is designed to be 1/10 the minimum input frequency. With this parameter, even when the input frequency is large, high noise transfer can be reduced by increasing current in the VCO 106 and thus increasing power drastically, by as much as a factor of 2.0-3.0.

Figure 2:
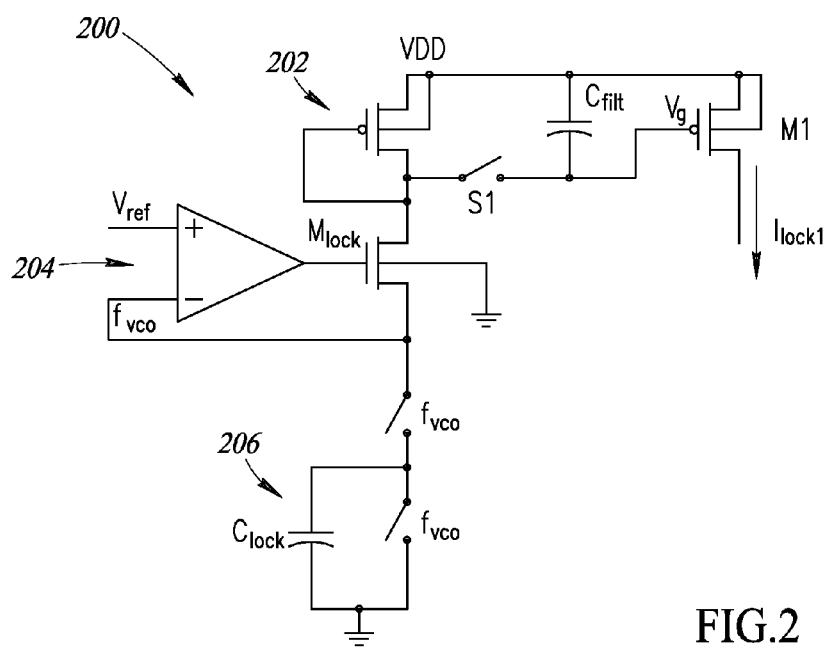
FIG. 2 is a schematic circuit diagram showing one exemplary embodiment of a frequency-to-current converter, as described herein.

FIG. 2 shows a switch-cap circuit 200 that can be used as a frequency-to-current (F to I) converter, according to one embodiment. The switch-cap circuit 200 generates, for example, a signal having a certain value of electric current, $I_{lock1}$, based on the frequency of the voltage-controlled oscillator, $f_{VCO}$. The switch-cap circuit 200 includes a MOSFET transistor 202, an operational amplifier 204, and a locking capacitor 206. $K_v \cdot I_p \cdot R_{loop}$ of the PLL 100 is determined and then adjusted against $f_{inf}$ to produce a desired $$\frac{f_{inf}}{UGB}$$

ratio for minimum noise transfer. Thus, UGB scales with $f_{inf}$ and gives the maximum possible UGB for the best noise performance, thus saving power. The ratio $$\frac{f_{inf}}{UGB}$$

is selected to be 10:1 in the example described herein. Because the UGB adjustment is performed digitally, the error depends on the number of sampling bits used to digitize the signal. For 5-bit precision, about ±3% error in the value of UGB can be achieved.

To determine the UGB, the PLL circuit 100 is allowed a dummy run. As the PLL circuit locks, the switch-cap circuit 200 shown in FIG. 2 is used to convert the VCO-locked frequency, $f_{VCO}$, to a current, $I_{lock1}$, while switch S1 is closed, thereby engaging a filter capacitor, $C_{filt}$. $I_{lock1}$, is generated based on the VCO-locked frequency according to the relationship $I_{lock1}=V_{ref} \cdot f_{vco} \cdot C_{lock}$. $V_{ref}$ can be obtained from a standard bandgap circuit. After a selected time interval, switch S1 is opened. The voltage at the gate of MOSFET M1 is stored across a capacitor $C_{filt}$ so that the switch-cap circuit 200 can be used again.

Figure 3:
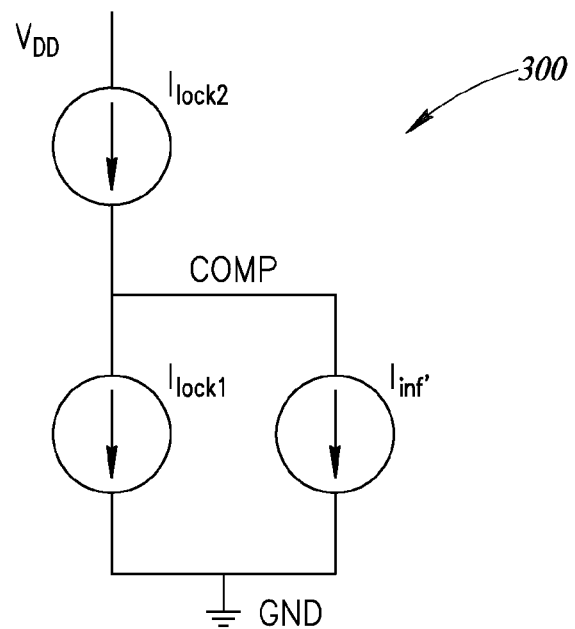
FIG. 3 is a schematic circuit diagram showing one exemplary embodiment of a current comparator, as described herein.

FIG. 3 shows a current comparator 300, according to one embodiment. The current comparator 300 compares $I_{lock2}$ to $I_{lock1}$. The current comparator 300 functions as a loop gain measurement device. An output of the comparator, COMP, transitions from digital low to high when $I_{lock2}-I_{lock1}$ exceeds the input current $I_{inf}$. When $V_{ref} \cdot K_v \cdot I_{test} \cdot R_{loop} \cdot C_{lock} > V_{ref} \cdot f_{inf} \cdot C_{lock} \cdot 0.628 \cdot N_{div}$, the condition $$K_v \cdot I_{test} \cdot R_{loop} > 0.628 \cdot N_{div} \cdot f_{inf}$$

will ensure that the UGB>$f_{inf}/10$. The comparator output COMP is then used to control a measurement circuit shown in FIG. 4.

Figure 4:
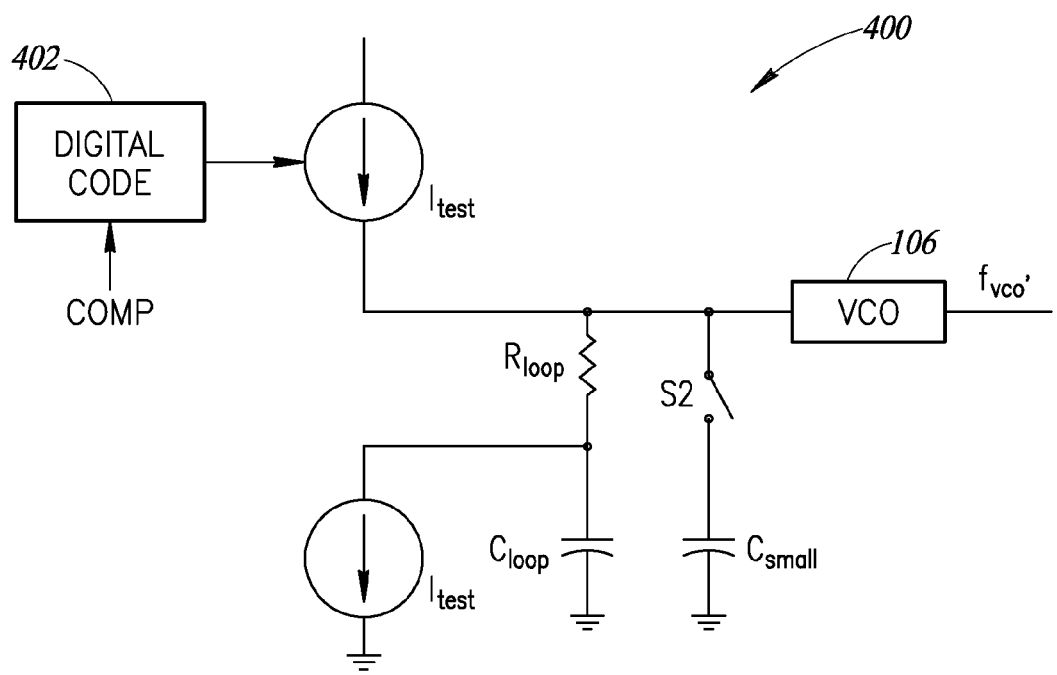
FIG. 4 is a schematic circuit diagram showing one exemplary embodiment of a loop gain bandwidth measurement stage, as described herein.

FIG. 4 shows a modification to the conventional PLL circuit of FIG. 1, to permit measurement of a loop gain bandwidth, according to one embodiment. The modified PLL circuit does not operate during the measurement phase. In a measurement configuration 400, the UGB is tested by adding a switch S2. The switch S2 is open during the UGB measurement, and closed when the PLL circuit is functioning. Opening the switch S2 permits measurement of loop parameters by removing $C_{small}$ from the circuit.

In the measurement configuration 400, when switch S2 is open, the comparator output COMP triggers a digital code 402 that simulates the output of the charge pump 104. The digital code 402 is a 5-bit counter that produces a test current $I_{test}$, in place of the charge pump current $I_{cp}$. A current $I_{test}$ is supplied to a resistor, $R_{loop}$, so that the voltage across $C_{loop}$ is substantially constant. As the digital code 402 counts up, $I_{test}$ also increases in steps, and the new signal having frequency $f_{vco}'$ is input into an F to I converter, to produce a new current, $I_{lock2}$, given by:

$$I_{lock2}=V_{ref} \cdot f_{vco}' \cdot C_{lock},$$

wherein $f_{vco}'=f_{vco}+K_v \cdot I_{test} \cdot R_{loop}$ and $K_v$ has units of Hz/V. Sufficient time is spent at each $I_{test}$ step so as to allow the F to I converter to settle before commencing the next iteration. At any time, $I_{lock2}-I_{lock1}$ is then given by $$V_{ref} \cdot K_v \cdot I_{test} \cdot R_{loop} \cdot C_{lock}.$$

Next, a second F to I converter converts $f_{inf}$, the input frequency, to a current $I_{inf}=V_{ref}*f_{inf}*C_{lock}$. Current mirrors are then used to scale the $I_{inf}$ by a factor of 0.628, $N_{div}$ times to yield $I_{inf}'$.

The Unity Gain Frequency (UGF) is given by $K_v \cdot I_{test} \cdot R_{loop}/2\pi N_{div}$. The UGF is desirably equal to about one-tenth the input frequency, $f_{inf}$, i.e., $$K_v \cdot I_{test} \cdot R_{loop}=(2\pi N_{div} \cdot f_{inf})/10=0.628 N_{div} \cdot f_{inf}.$$

As soon as UGB=$f_{inf}/10$, COMP transitions from 0 to 1, which stops the digital code 402 from incrementing any further. As a result, $I_{test}$ becomes the new value of $I_{cp}$, the charge pump current. The UGB then depends only on $f_{inf}$. Thus, the UGB will have a variation that is determined by the resolution of the signal produced by the digital code 302. With 5-bit resolution, the UGB varies by only about +/−3%.

When the UGB is at an optimum value, the integrated jitter due to the VCO 106 will be low, and thus a smaller current can be input into the VCO, thereby saving as much as two to three times the PLL power.

Figure 5:
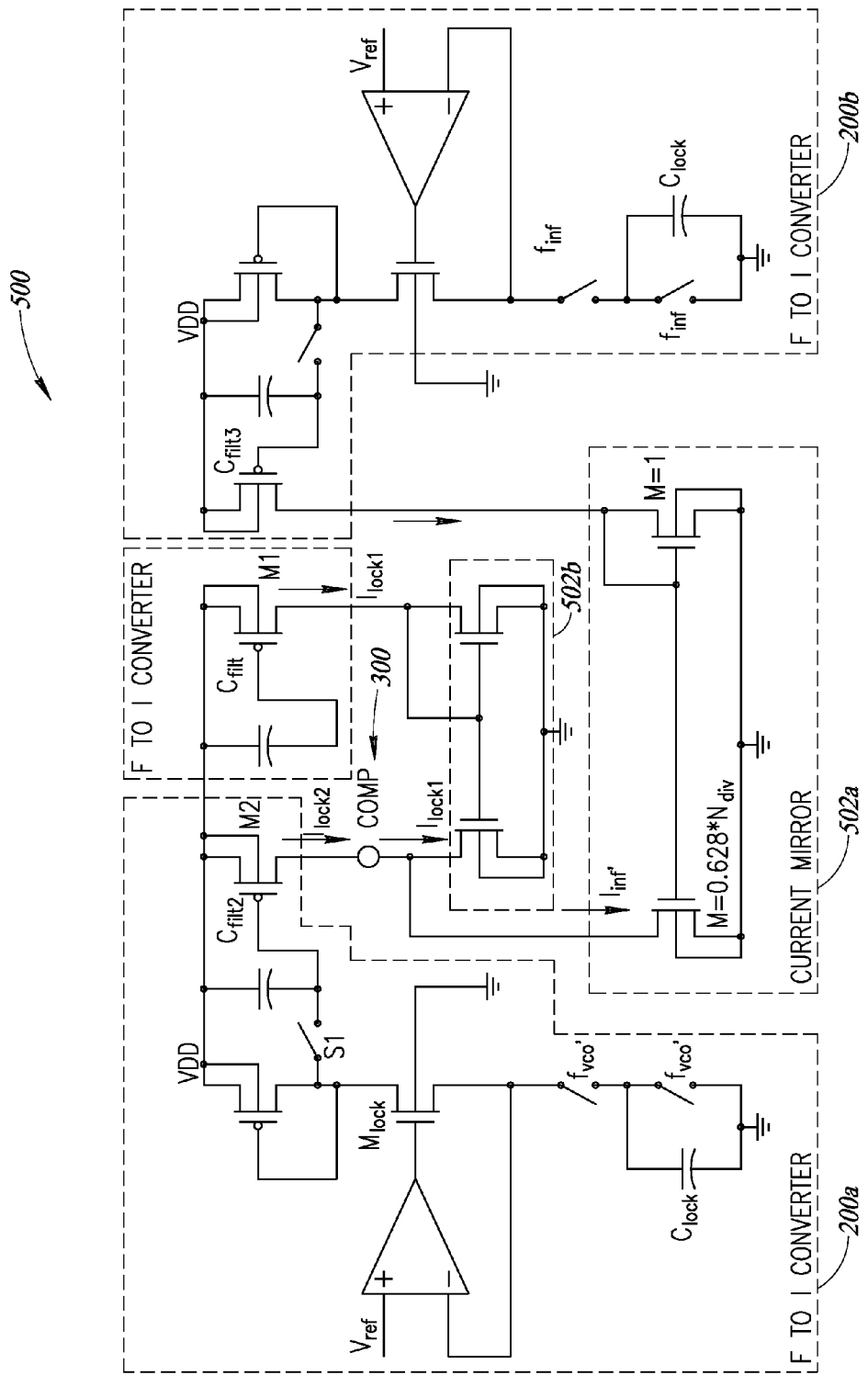
FIG. 5 is a schematic circuit diagram showing an exemplary configuration of F to I converters, current mirrors, and a comparator that can be used to enhance a phase locked loop circuit, according to one embodiment as described herein.

FIG. 5 summarizes additional circuitry 500 that can be used to monitor the digital PLL to improve noise performance and save power, according to one embodiment. Such additional circuitry includes two frequency-to-current (F to I) converters 200a, 200b, parallel current mirrors 502a, 502b, and a loop gain bandwidth measurement device 300. The F to I converter 200a is used first to generate $I_{lock1}$ by connecting S1 to the gate of M1 in the PLL dummy run mode. Then the F to I converter 200a generates $I_{lock2}$ by connecting 51 to the gate of M2 in the measurement mode. In measurement mode, a UGB equal to the product of the VCO gain, the charge pump current, and a loop filter resistance, $K_v \cdot I_p \cdot R_{loop}$, can be measured and adjusted to reduce noise transfer within the PLL circuit. The v gain, $K_v$, has units of Hz/V. The digital measurement error is calculated to be only about 3%, using 5-bit precision.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

It will be appreciated that, although specific embodiments of the present disclosure are described herein for purposes of illustration, various modifications may be made without departing from the spirit and scope of the present disclosure. Accordingly, the present disclosure is not limited except as by the appended claims.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electronic circuit comprising:
   a digital phase locked loop;
   a measurement stage that includes a frequency-to-current converter, the measurement stage configured to measure and adjust a gain of the phase locked loop; and a current comparator that triggers operation of the measurement stage.

2. The electronic circuit of claim 1, wherein adjusting a gain of the phase locked loop adjusts a unity gain bandwidth of the phase locked loop.

3. The electronic circuit of claim 1, further comprising a switch that, when open, engages the measurement stage and when closed, engages the digital phase locked loop.

4. The electronic circuit of claim 1, further comprising a switch that, when closed, engages the frequency-to-current converter.

5. The electronic circuit of claim 1 wherein the phase locked loop includes:
   a phase frequency detector;
   a charge pump coupled to an output of the phase frequency detector;
   a voltage-controlled oscillator coupled to receive a drive signal input from the charge pump; and
   a loop divider coupling an output of the voltage-controlled oscillator to an input of the phase frequency detector.

6. The electronic circuit of claim 5 wherein, during a measurement phase, the charge pump is replaced by a digital counter to produce a test current.

7. The electronic circuit of claim 1, further comprising a current mirror coupled to the output of the frequency-to-current converter.

8. The electronic circuit of claim 1 wherein a measurement error of the measurement stage is within the range of about 2-4%.

9. The electronic circuit of claim 1 wherein the digital measurement uses five-bit precision.

10. The electronic circuit of claim 1 wherein a ratio of the unity gain bandwidth to an input frequency is set to 10.

11. A method of stabilizing a digital phase locked loop circuit, the method comprising:
    electrically isolating the digital phase locked loop;
    measuring a unity gain bandwidth associated with the digital phase locked loop; and
    adjusting the digital phase locked loop circuit to maintain a ratio of the unity gain bandwidth to an input frequency.

12. The method of claim 11 wherein the measuring includes converting a frequency to a current.

13. The method of claim 11 wherein the ratio is 0.1.

14. The method of claim 11 wherein the measuring includes a current comparison operation.

15. The method of claim 11 wherein operation of the digital phase locked loop is suspended while measuring.

16. The method of claim 11 wherein variation in the unity gain bandwidth is determined by a bit resolution.

17. A stable phased lock loop circuit, characterized by a unity gain bandwidth that is at least $1/10$ an input frequency.

* * * * *